US006993463B1

(12) United States Patent
Ewsuk et al.

(10) Patent No.: US 6,993,463 B1
(45) Date of Patent: Jan. 31, 2006

(54) METHOD FOR DIE DESIGN AND POWDER PRESSING

(75) Inventors: Kevin G. Ewsuk, Albuquerque, NM (US); Jose G. Arguello, Jr., Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 805 days.

(21) Appl. No.: 09/765,768

(22) Filed: Jan. 18, 2001

(51) Int. Cl.
*G06F 17/10* (2006.01)
*G06F 19/00* (2006.01)

(52) U.S. Cl. .......................... 703/2; 703/22; 700/204; 700/206; 419/23

(58) Field of Classification Search ................ 700/204, 700/206, 212, 197, 200; 703/2, 22; 419/23; 75/300
See application file for complete search history.

(56) References Cited

U.S. PATENT DOCUMENTS 4,912,664 A * 3/1990 Weiss et al. ................ 716/20
5,517,871 A * 5/1996 Pento ........................ 73/865.9

OTHER PUBLICATIONS

Ewsuk, K.G. Modeling Ceramics May Improve Yields, IEEE Computational Science and Engineering, In the News, vol. 2, No. 4, Winter 1995, p. 83.*
Carr, K. and Bono, E., "PCS Elite™—A Complete Die Compaction Software Package," Advances in Powder Metallurgy & Particulate Materials—1999: Proceedings of the 1998 International Conference on Powder Metallurgy & Particulate Materials, 3(10-13), Metal Powder Industries Federation; APMI International, 10-111-10-125, 1999.

Aydin, I., Briscoe, B., and Ozkan, N., "Application of Constitutive Models on Ceramic Powder Compaction via Finite Element Method,"in *Diversity Into the Next Century*, Proceedings of the 27th International SAMPE Technical Conference, 27, eds. R. J. Martinez, H. Arris, J. A. Emerson, and G. Pike, SAMPE International, Covina, California, 590-6, 1995.
Aydin, I., Briscoe, B., and Ozkan, N., "Modeling of Powder Compaction: A Review," MRS Bulletin, 22 [12] 45-51, 1997).
Zipse, H., "Finite-Element Simulation of the Die Pressing and Sintering of a Ceramic Component" J. European Ceram. Soc., 17, [14] 1707-13, 1997.
Aydin, I., Briscoe, B., and Sanliturk, K., "Density Distributions During the Compaction of Alumina Powders: a Comparison of a Computational Prediction with Experiment," Comp. Mater. Sci., 3, 55-68, 1994.

(Continued)

*Primary Examiner*—Russell Frejd
(74) *Attorney, Agent, or Firm*—Elmer A. Klavetter

(57) ABSTRACT

A method of designing a primary geometry, such as for a forming die, to be used in a powder pressing application by using a combination of axisymmetric geometric shapes, transition radii, and transition spaces to simulate the geometry where the shapes can be selected from a predetermined list or menu of axisymmetric shapes and then developing a finite element mesh to represent the geometry. This mesh, along with material properties of the component to be designed and powder, is input to a standard deformation finite element code to evaluate the deformation characteristics of the component being designed. The user can develop the geometry interactively with a computer interface in minutes and execute a complete analysis of the deformation characteristics of the simulated component geometry.

13 Claims, 5 Drawing Sheets

OTHER PUBLICATIONS

Aydin, I., Briscoe, B., and Sanliturk, K., "Dimensional Variation of Die-Pressed Ceramic Green Compacts: Comparison of a Finite Element Modeling with Experi- ment," J. European Ceram. Soc., 17, 1201-12, 1997.

Keller, J., French, J., Dinger, B., McDonough, M., Gold, B., Cloutier,C., Carinic, L., Van Horn, E., Ewsuk, K., Blumenthal, B., "Industry, Government Team to Improve Ceramic Manufacturing," Bull. Am. Ceram. Soc., 77 [10] 52-7, 1998.

Sjaardema, G., "Overview of the Sandia National Laboratories Engineering Analysis Code Access System," Sandia National Laboratories Technical Report, SAND92-2292, 1994.

Ewsuk, K., Arguello, J., Zeuch, D., Fossum, A., "Real-Time Design of Improved Powder Pressing Dies Using Finite Element Method Modeling," Sandia National Laboratories Technical Report, SAND2000-3045, 2000.

* cited by examiner

METHOD FOR DIE DESIGN AND POWDER PRESSING

This invention was made with Government support under Contract No. DE-AC04-94AL85000 awarded by the Department of Energy. The Government has certain rights in the invention.

BACKGROUND OF THE INVENTION

The invention relates to a method, implemented within a computer interface, to simplify and enhance the use of numerical simulation tools to design a primary geometry for a powder compact and to design the pressing process used to shape a powder by compaction. More particularly, the invention relates to an interface that utilizes pre-defined generic geometric configurations to simplify the use of finite element method modeling software to more efficiently design the shape and size a powder compact, a forming die to shape a powder compact, and the pressing process used to form a powder compact.

Conventional ceramic component manufacturing often involves processing and fabrication with raw materials in powder form. Granulated powder is formed into a "green" (i.e., not sintered) body of the desired size and shape by consolidation, often by pressing or compacting nominally dry powder in a mold or die (also known as tooling). Ceramic powders are commonly pressed in steel dies or viscoelastic (e.g., rubber) bags with the aim of producing a near-net-shape powder compact for subsequent sintering. Density gradients introduced into a green powder compact during the pressing operation are often severe enough to cause distortions in the shape of the part during sintering due to non-uniform shrinkage. In such cases, extensive and costly machining of the green body, and diamond grinding of the sintered body, can be required to produce a finished part of the desired final shape and size. In severe cases, density gradients and non-uniform shrinkage can create cracks or other performance limiting defects in a finished part after sintering, rendering the part useless. Likewise, severe density gradients can result in powder compacts that break during ejection from the forming die, or that are too fragile to handle during subsequent processing, decreasing manufacturing yields.

Empirical relationships (i.e., rules of thumb) exist to help guide component design and the compaction process used to fabricate powder compacts; however, such relationships do not provide the understanding necessary to control component and die design, and the compaction parameters to eliminate density gradients over a wide variety of design and processing conditions. Consequently, a designer is often must use an expensive and time-consuming trial and error process to develop new components, forming dies, and forming processes. This traditional approach to component design and development is inefficient, expensive, and unreliable. Also, the traditional approach inevitably introduces density gradients of unknown and uncontrolled magnitude during the powder pressing process that contribute to shape distortion, uncontrolled sintering, and ultimately, unpredictable component performance and reliability.

An alternate design and powder processing approach for more efficient ceramic component manufacturing is highly desirable. Particularly, interest has grown in developing and applying computer simulation tools to address this problem. A science-based constitutive materials model can be implemented within a numerical computer simulation tool to aid in the cost-effective design of forming dies and pressing processes to manufacture improved performance and reliability ceramics. A science-based approach provides the insight necessary to control component geometry and the powder compaction process to minimize density gradients in green powder compacts.

Some powder compaction modeling software already exists for metal and ceramic powder processing. Carr and Bono have described compaction modeling software for metal powders (Carr, K. and Bono, E., "PCS Elite™—A Complete Die Compaction Software Package," Advances in Powder Metallurgy & Particulate Materials—1999: Proceedings of the 1998 International Conference on Powder Metallurgy & Particulate Materials, 3(10–13), Metal Powder Industries Federation; APMI International, 10-111-10-125, 1999). Compaction software for ceramic powders is described by Aydin et al. (Aydin, I., Briscoe, B., and Ozkan, N., "Application of Constitutive Models on Ceramic Powder Compaction via Finite Element Method," in *Diversity Into the Next Century*, Proceedings of the 27th International SAMPE Technical Conference, 27, eds. R. J. Martinez, H. Arris, J. A. Emerson, and G. Pike, SAMPE International, Covina, Calif., 590–6, 1995) (Aydin, I., Briscoe, B., and Ozkan, N., "Modeling of Powder Compaction: A Review," MRS Bulletin, 22[12] 45–51, 1997), and Zipse, (Zipse, H., "Finite-Element Simulation of the Die Pressing and Sintering of a Ceramic Component" J. European Ceram. Soc., 17, [14] 1707–13, 1997).

Realistic predictions of spatial density variations within ceramic powder compact have been made using a cap-plasticity constitutive materials models within an finite element framework by Aydin et al. (Aydin, I., Briscoe, B., and Sanliturk, K., "Density Distributions During the Compaction of Alumina Powders: A Comparison of a Computational Prediction with Experiment," Comp. Mater. Sci., 3, 55–68, 1994). The generic cap-plasticity constitutive model captures the mechanical behavior of granulated ceramic powder during compaction reasonably well. The cap-plasticity constitutive model is comprised of a stationary shear failure surface and a non-stationary, strain-hardening cap that define the elastic regime for the compaction of a powder in response to both hydrostatic compression and shear, when the second invariant of the deviatoric stress is plotted versus the first invariant of stress. The cap-plasticity constitutive model allows for an initially "small" cap that grows and hardens with increasing pressing pressure during powder compaction, an elastic rebound upon unloading (springback), and the possibility for secondary yielding (delamination) if unloading results in an intersection with the shear failure surface.

Compaction modeling tools have been used to simulate powder compaction in two-dimensional and complicated three-dimensional geometry powder compacts. Furthermore, it has been demonstrated that finite element compaction model predictions are accurate enough to be useful design tools in ceramic manufacturing. Compaction modeling has been used to predict shape distortions after pressing by Aydin et al. (Aydin, I., Briscoe. B., Sanliturk. K., 1997, "Dimensional Variation of Die-Pressed Ceramic Green Compacts: Comparison of a Finite Element Modeling with Experiment," J. European Ceram. Soc., 17, 1201–12.). Additionally, it has been shown that compaction model predictions can be used to guide die designs and pressing processes to minimize density gradients by Keller et al. (Keller, J., French, J., Dinger, B., McDonough, M., Gold, B., Cloutier, C., Carinic, L., Van Horn, E., Ewsuk, K., Blumenthal, B., 1998, "Industry, Government Team to Improve Ceramic Manufacturing," Bull. Am. Ceram. Soc., 77 [10] 52–7.).

Keller et al. described how modeling can provide guidance on the aspect ratios, transition radii, and pressing balance (i.e., the relative displacements of a top and bottom punch in dual-action pressing) to control and minimize density gradients. Zipse (1997) demonstrated that model simulations also can be used to guide die design in combination with green machining to minimize density gradients in the final product. Zipse showed that powder compacts can be formed intentionally oversize such that outer regions with severe density gradients can be physically removed by green machining prior to sintering to net shape.

An appealing aspect of finite element modeling is that realistic and informative simulations of ceramic powder compaction can be completed on simple and relatively complex geometry compacts. Furthermore, simulations can be completed using a workstation, a desktop computer, or even a laptop computer. Additionally, commercial software packages are readily available for finite element modeling.

A general disadvantage of finite element modeling is that reliable and useful simulations are complex, and generally require specialized expertise in computing and mechanics to obtain meaningful results. In particular, constructing the finite element mesh required to run a finite element computer simulation can be extremely time-consuming. Hours to several days can be required to construct suitable mesh inputs.

Traditional methods of generating a finite element mesh for numerical simulations are labor and time intensive. In general, solid mechanics finite element codes have their own mesh generator inherent as part of the input, and are capable of inputting a mesh from an external mesh generator. Older finite element codes can require the input of the nodal numbers and nodal coordinates as well as element number and element connectivity itself, along with a material identification to tag each element's properties before performing finite element calculations (i.e., the entire mesh, material properties, boundary conditions, and initial conditions are defined externally, and input manually). More recent finite element codes generally have a pre-processing tool with which the user defines the geometry to be analyzed, and specifies of how to subdivide that geometry into a finite element mesh. The pre-processing tool requires, as input: points; lines; sides; regions; schemes; element side flags; nodal flags; and body definition. Two or more points define a line; a set of contiguous lines defines a region; and a collection of regions defines a body. Flags are attached to a region to define the properties of that region. Flags are attached to lines and/or sides to define the boundary conditions and/or loading conditions. Lines are subdivided with parameters and increments to generate nodes and elements via the scheme card that is attached to a region. When all of this is done, the mesh with the appropriate flags is then written to a database that is readable by the finite element code. Within the finite element code, the user defines specific boundary conditions (e.g., static and loading conditions) to attach to the flagged element sides and/or nodes, and the corresponding material properties and material behavior corresponding to the flags attached to the different regions. The geometry, material properties, boundary conditions, and initial conditions are provided as input to a deformation, nonlinear, quasi-static, finite element computer program/code, which, when executed, calculates deformation characteristics. The deformation characteristics can then be evaluated to determine the acceptability of the primary geometry and mesh for that geometry, which subsequently be can be modified as deemed necessary to complete a meaningful simulation.

Conventional use of the aforementioned pre-processing finite element tools to define the overall component geometry and build the mesh for a moderately complex part can take several days (e.g., often three to five days) of manual effort. Additionally, effective use of existing numerical modeling software currently requires significant finite element modeling expertise, insight into the underlying mechanics of the compaction process, and experience in using the cap-plasticity constitutive model. Furthermore, constructing the finite element mesh (i.e., computational grid) required to complete the numerical analysis, as well as visualizing results from the database output from the numerical simulation requires additional expertise with several pre- and post-processing tools. These significant requirements and potential impediments for using the underlying software severely limit the application of existing numerical simulation tools by the typical engineer on the production floor.

Broader application of numerical simulation tools and computer-aided component design and powder processing require a more user-friendly tool than the general-purpose, numerical simulation capability currently available. A computer interface that allows a novice with minimal training to more easily define the component geometry, construct the finite element mesh, set-up the numerical simulation, complete the analysis, and visualize the results would significantly enhance the utility of numerical simulation software in the manufacturing environment. In particular, user-friendly software to address component geometry variability without having to manually construct complicated finite element meshes from scratch would significantly enhance the value and utility of numerical simulation tools to the novice user.

DESCRIPTION OF SPECIFIC EMBODIMENTS

Figure 1:
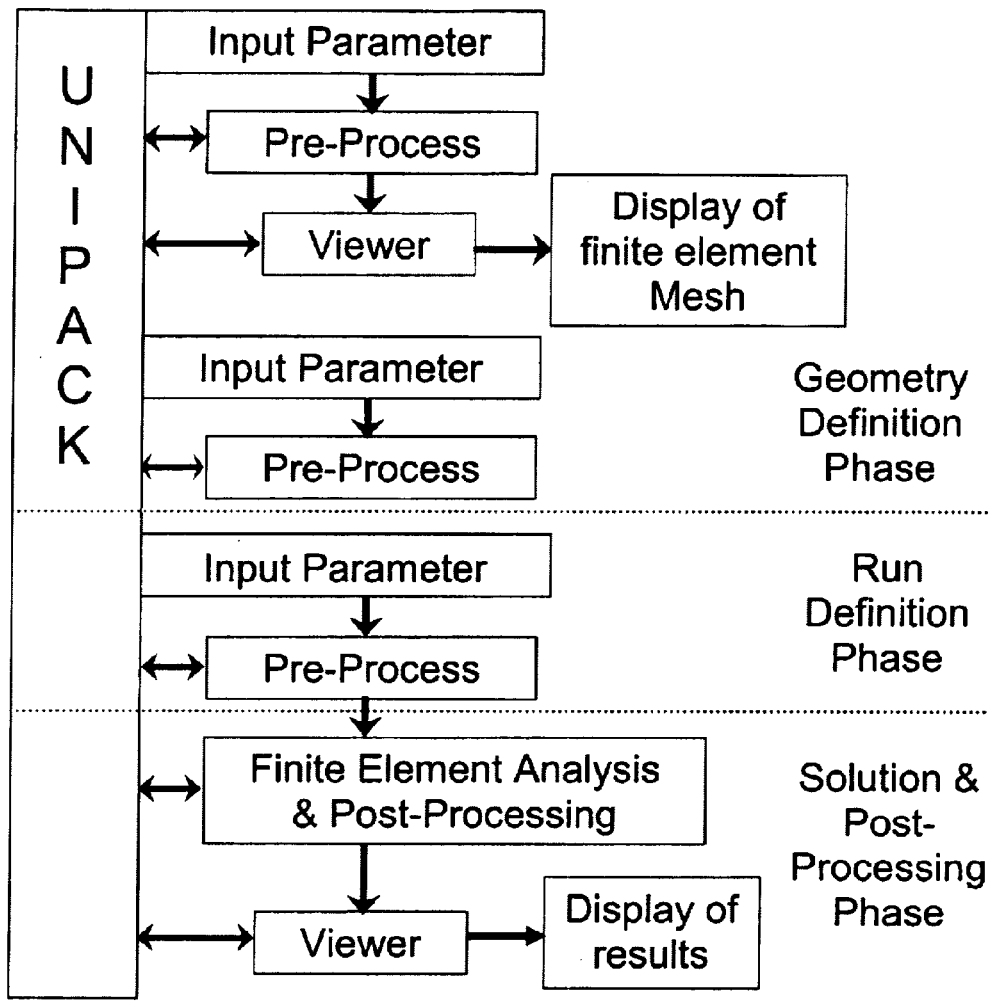
FIG. 1 illustrates a flow sheet of one embodiment of the method of the present invention showing the Geometry Definition phase, the Run Definition phase and the Solution & Post-processing phase.

Computer models are being used to simulate the compaction of powders, and to help design the forming dies/tooling used in powder compaction. Finite element computer models have been shown to be useful in these applications, but have the serious disadvantage of requiring time-intensive expertise to generate the finite element mesh and set up the computer simulations. Additionally, specialized modeling expertise is required to set up and execute a meaningful analysis and interpret the simulations to obtain meaningful results.

In the method of the present invention, a method and algorithm have been developed and incorporated within a user-friendly computer interface (referred to hereinafter as 'UNIPACK') that considerably simplifies and reduces the time required to design a primary geometry, generate a mesh, and execute a finite element computer model simulation of powder compaction for that geometry (Ewsuk et al., Sandia National Laboratories Technical Report, SAND2000-3045, Albuquerque, N. Mex., 2000; incorporated herein by reference). In particular, the UNIPACK interface computer code allows a novice user, with minimal training, to quickly and easily: 1) construct a primary geometry from a subclass of pre-defined axisymmetric geometric shapes; 2) generate a finite element mesh for the primary geometry; 3) set up and run a finite element powder compaction simulation for said primary geometry, and 4) visually review the results of the computer simulation. The present invention has application in the ceramics industry for pressing green powder compacts, in the powder metallurgy industry for pressing powder compacts, and in the pharmaceuticals industry for pressing pills.

The UNIPACK computer code is a top-level driver that interfaces with a series of finite element software packages (for example, the Sandia Engineering Analysis Code Access System, which includes the JAS3D finite element code; Sjaardema, G., Sandia National Laboratories Technical Report, SAND92-2292, 1994) to automatically set up and run a powder compaction analysis with minimal user input. UNIPACK is composed of pre-built files that contain the logic to generate a primary geometry, such as a die, and the finite element mesh for that geometry, and to setup and run a finite element simulation. UNIPACK queries the user for specific information, builds and parses input parameter files to generate a finite element mesh, runs a finite element simulation from the data input by the user, and displays the simulation results. The expertise required to build the input deck, run the finite element analysis code, and post-process the results resides in the algorithms within the UNIPACK code (computer program package). The user simply responds to a series of computer screen prompts that generally queries the user for information about the geometry, properties, and boundary conditions, of the system to be analyzed, evaluates the quality of the primary geometry and finite element mesh that are automatically generated, and analyzes the graphical results generated from the simulation.

There are three distinct phases that are automatically handled by the UNIPACK code, including the: 1) Geometry Definition Phase; 2) Run Definition Phase; and 3) Solution & Post-processing Phase. The Geometry Definition Phase queries the user for information to define the component geometry, builds the user parameter files, and parses the files to the finite element pre-processing tools to build the finite element mesh for the analysis. The Run Definition Phase queries the user for the parameters that define the pressing conditions, friction coefficients, and the behavior of the material being pressed, builds a file of user parameters, and parses this file to a finite element pre-processing tool to build an input deck for the finite element analysis program (e.g., JAS3D). The Solution & Post-processing Phase submits the finite element analysis run, and, after the analysis, calls the finite element post-processing tool to query the results database and generate a postscript file of select results that is launched by a postscript viewer to display the file to the user. FIG. 1 illustrates the three phases handled by UNIPACK, the user parameter files that are built, and how UNIPACK interfaces with a standard finite element method (FEM) toolkit and a viewing software package, such as a postscript viewer, to generate the primary geometry and mesh, set up the run, complete the finite element simulation, and display the results.

One significant benefit of the UNIPACK code is that it makes the generation of the finite element mesh required for the finite element simulation inherently quick and easy. Within the subject of the present invention, a finite element mesh for a complex geometry component can be generated and modified much more easily and in considerably less time than is possible with the more traditional tools. More specifically, as compared to the traditional labor-intensive process of building a finite element mesh, which can take hours to days, a finite element mesh for a complex primary geometry component can be generated in minutes using the method of the present invention. In general, a finite element mesh for a complex primary geometry component can be generated in less than 1 hour using the method of the present invention. This time savings represents a significant advantage of the UNIPACK code that makes finite element modeling more efficient and readily usable by a non-expert in computer modeling.

Figure 2:
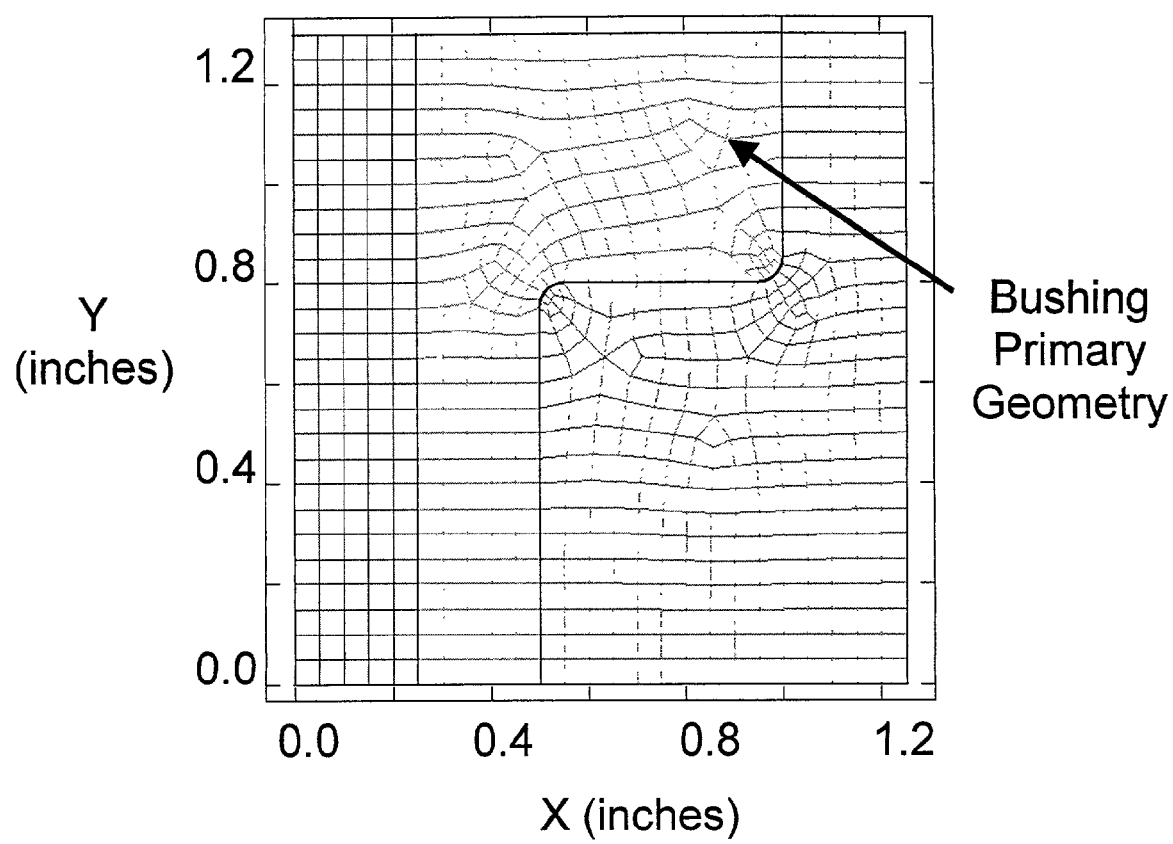
FIG. 2 shows an example of a 2-dimensional visual display representation of a primary component geometry (i.e., a bushing) and the corresponding finite element mesh for that component geometry, depicting the right half of the axisymmetric bushing, which is located between the steel mandrel (left) and the steel die body (right) used to shape the part.

In the present invention, the primary geometry of a component or forming die is defined by the user specifying the physical dimensions of a combination of pre-defined axisymmetric geometric shapes, as well as the transition regions used to join those shapes. Next, the user defines the size of the elements in the pre-defined axisymmetric geometric shapes and in the transition regions. Then, standard finite element processing tools, without further user interaction, generate the finite element mesh. The UNIPACK computer software incorporating this method can optionally display a visual representation of the primary geometry, and the finite element mesh for that primary geometry for evaluation by the user, such as illustrated in FIG. 2. The user employs simple heuristics to evaluate the mesh generated, and to determine if it is acceptable for completing a meaningful finite element simulation. If modifications are required, the user can start over, or can edit the user input to redefine the primary geometry or the finite element mesh, as appropriate, to complete a meaningful finite element simulation.

Figure 3:
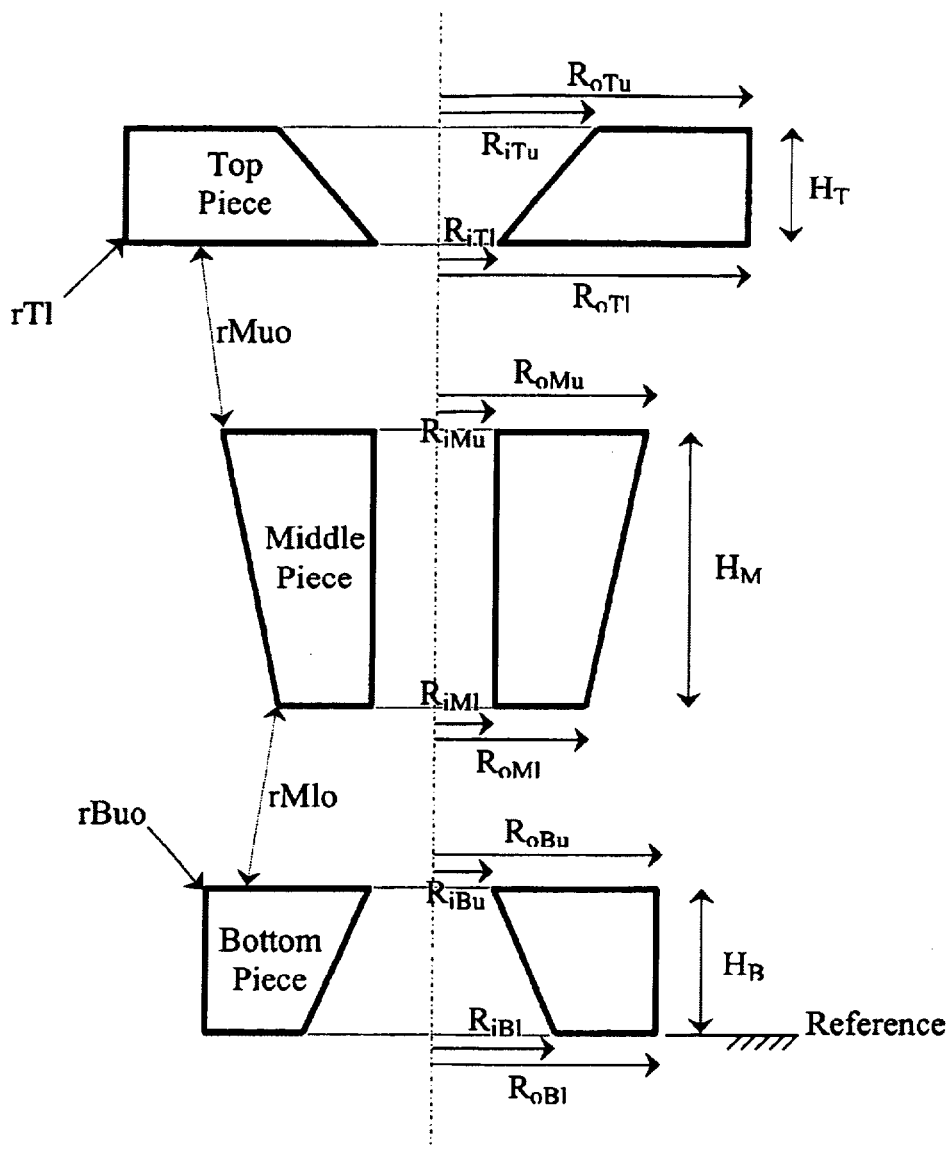
FIG. 3 illustrates a complex geometry component comprised of three axisymmetric geometry pieces joined axially.

Within the present invention, a simpler and more efficient method of designing a complex primary geometry component, and the finite element mesh for that primary geometry, was made possible by limiting the scope of the class of problems to be handled by the software to a primary component geometry that is axisymmetric. In particular, the flexibility to model simple and complex geometry components was achieved by developing the higher-level specialized method and software of the present invention to wrap around a general finite-element program to address geometry variability within a specific subclass of axisymmetric compacts that are quite common in the ceramics industry. A complex primary geometry component is generated by interconnecting two or more axisymmetric geometric shapes, such as by axially stacking axisymmetric pieces with optional transition radii between the connecting pieces. UNIPACK allows the user to generate complex primary geometry components by axially joining two or more axisymmetric geometric shapes whose physical dimensions are defined by the user (in the most simple geometry, one geometric shape can be used). FIG. 3 illustrates how a complex primary geometry component can be formed from three axisymmetric pieces joined axially, with the top piece joined to the middle piece, and the middle piece joined to the bottom piece by transition radii. The individual (i.e., top, middle or bottom) pieces can be solid or hollow, and the outer and, as appropriate, inner diameters of the top and bottom of each piece are defined by the user, making tapered and conical geometries possible. Additionally, the user defines the height of each piece and the geometry of the transition regions between each piece. It is therefore possible to generate complex primary geometry ceramic components like counter-bores and bushing stems that are commonly fabricated by powder pressing.

In the method of the present invention, in response to computer line prompts, the user first defines the primary geometry of the component or forming die for the compaction simulation, considering the size and shape both before and after compaction. The user also responds to a set of queries as to the transition radii between pieces, and whether or not the mating surfaces are straight. The user also responds to a set of queries as to the pressing (boundary) conditions and the material type of the primary geometry. Alternatively, the user can supply this information to the software algorithm or package without using computer generated prompts, such as by a data file. The UNIPACK computer code uses the user-supplied information to construct and display a finite element mesh, and the information is then relayed to the finite element analysis program to automatically execute the powder compaction analysis and display the results.

Figure 4:
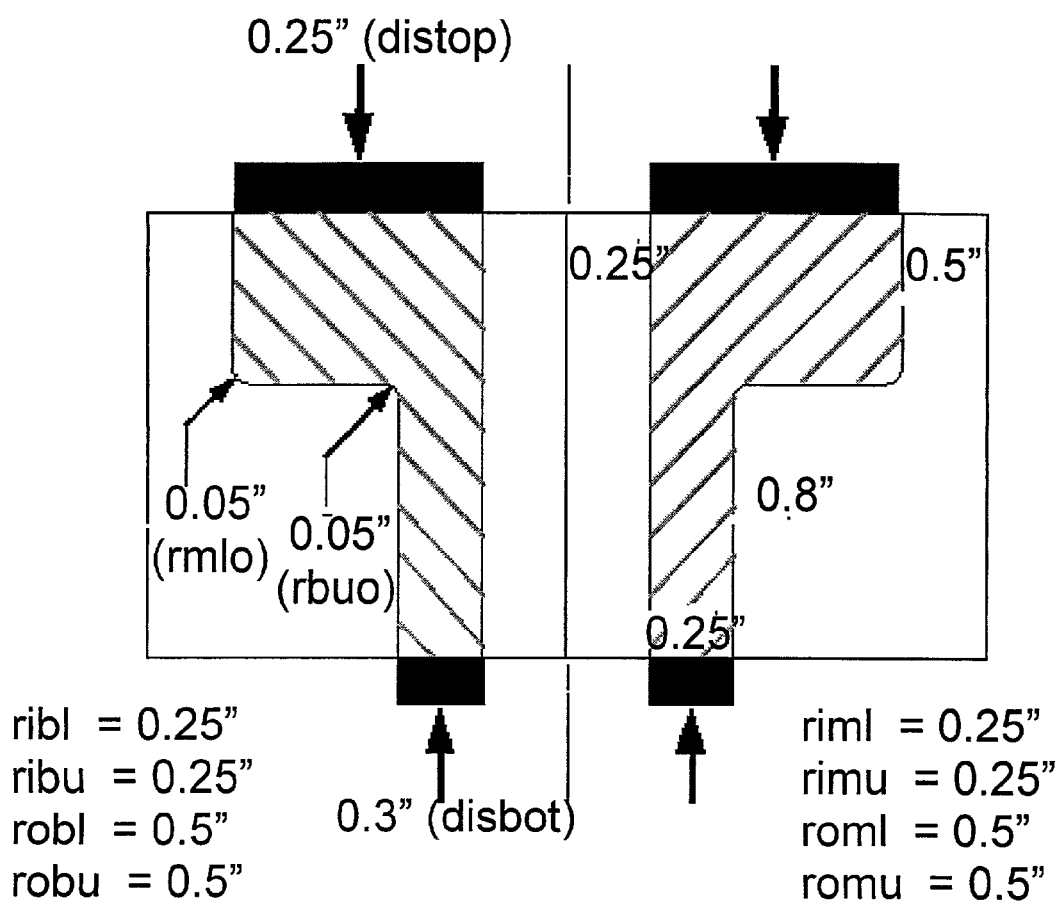
FIG. 4 illustrates the geometry and information required to simulate the compaction of a bushing primary geometry component.

In one embodiment of the present invention, the UNIPACK code queries the user to define the geometric shapes that are to be used to form a particular primary geometry component. The user specifies the shape variables for each predetermined geometric shape (e.g., heights and radii) selected from a list or menu of geometric shapes and then the computer code builds the primary geometry and parses the input parameter files to the finite element software. Any axisymmetric geometric shape can be utilized, including, but not limited to, cylinders, cones, toroids, spheres, parallelpipeds, ellipsoids, and polyhedrons. More specifically, to define the bushing geometry illustrated in FIG. 4, the user responded to a set of line queries from the computer, incorporating the method of the present invention, to provide the information necessary to define the component geometry. In this specific example, two cylindrical geometric shapes were joined axially with the top toroid having a height of 0.8 inches, an inner radius, ribl, of 0.25 inches and outer radius, robl, of 0.5 inches before pressing. The bottom toroid had a height of 0.5 inches, an inner radius, riml, of 0.25 inches and outer radius, roml, of 1.0 inches before pressing. The top and bottom pieces were joined by a transition radius, rbuo, of 0.05 inches.

An example of the computer line queries that the user sees on the computer screen to define the initial component geometry, with the appropriate user input to the right, is displayed below.

| GEOMETRY DEFINITION PHASE: | |
|---|---|
| Enter the number of pieces comprising the component: | 2 |
| Enter the bottom inner radius (rib1) (inches): | 0.25 |
| Enter the bottom outer radius (rob1) (inches): | 0.5 |
| Enter bottom height (hb) (inches): | 0.8 |
| Enter the upper inner radius (rim1) (inches): | 0.25 |
| Enter the upper inner radius (rom1) (inches): | 1.0 |
| Enter the upper height (hu) (inches): | 0.5 |
| Upper and bottom inner part surfaces mate; | |
| Is mated surface straight (y/n)? | y |
| Enter a radius for outer lower transition | 0.05 |
| Enter the number of elements for this transitional arc: | 5 |
| Enter a radius for the outer upper transition | 0.05 |
| Enter the number of elements for this transitional arc: | 5 |

The UNIPACK code then took the geometry information input by the user, generated a two-dimensional finite element mesh, called up a postscript file of the mesh, and automatically displayed the file on the computer screen, all without further user interface or input. FIG. 2, shows the finite element mesh generated from the user-supplied input for the bushing geometry example. The user reviewed the postscript file to determine that the primary geometry was correct, and that the finite element mesh was appropriate to complete a meaningful analysis.

UNIPACK provides the user the option to accept the component geometry and finite element mesh, or to edit the file to refine the primary geometry and/or the mesh. If the user edits the file, the process described in the preceding paragraph is repeated. After the user-acceptable component geometry and mesh were generated, a three-dimensional finite element mesh was generated.

The pressing (boundary) conditions were then defined by the user to set up the pressing simulation. For the bushing geometry example, the top ram was displaced downwards, distop, 0.25", to compact the powder and produce a pressed height of 0.5" in the top piece. Additionally, the bottom ram was displaced simultaneously upwards, disbot, 0.30" to compact the powder and produce a pressed height of 0.8" in the bottom piece. Friction coefficients, infric and outfric, of 0.25 were input by the user for the powder in contact with the inner mandrel and the outer die body to complete the analysis. Additionally, the material type (in this case, 94% alumina powder) was selected from an existing list or menu of materials, and its properties were used to complete the compaction simulation. The user can either supply the material physical properties or can select a material from a list or menu offered by the algorithm where the properties of these materials are already included in the algorithm or computer package database.

An example of the computer line queries that the user sees on the computer screen to define the pressing conditions and the overall bushing geometry after the compaction simulation, with the appropriate user input to the right, is displayed below.

| RUN DEFINITION PHASE: | |
|---|---|
| Enter a Title (<=80 characters) for this run: | BE1 |
| Enter the Amount of Upper Platen Displacement (distop): | −0.25 |
| Enter the Amount of Lower Platen Displacement (disbot): | 0.3 |
| Enter the Inner Die/Part Friction Coefficient (infric): | 0.25 |
| Enter the Outer Die/Part Friction Coefficient (outfric): | 0.25 |
| Enter ID For Your Powder 1 (94% Al.), 2 (99.5% Al.), or 3 (Zirc.): | 1 |

The time required by the novice user to input of all of the aforementioned data required to run the finite element simulation took less than 10 minutes.

Figure 5:
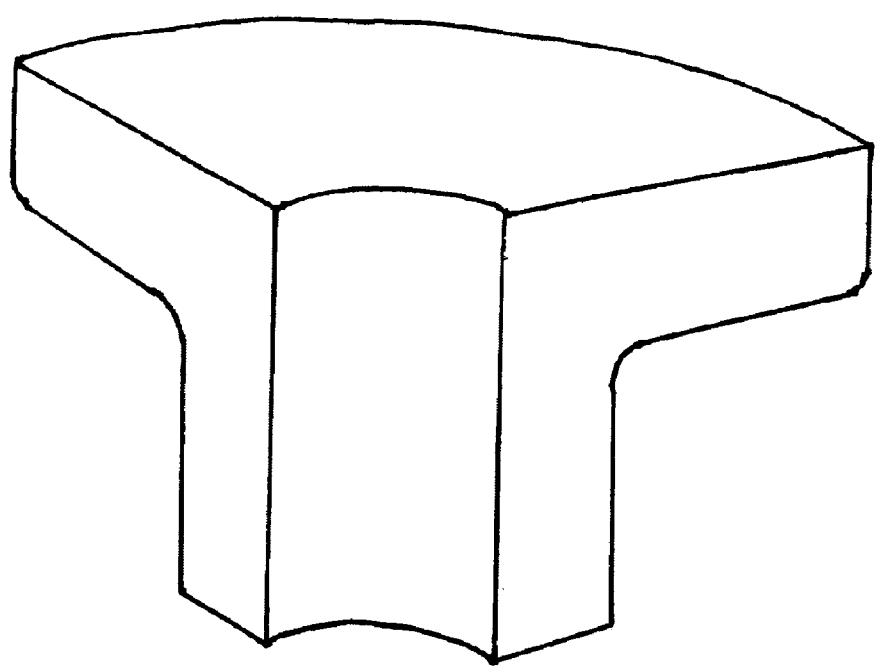
FIG. 5 shows the fringe plot of spatial relative density in three dimensions of a quarter section of an axisymmetric geometry bushing after dual-action pressing.

After the user input and accepted the aforementioned information, UNIPACK automatically launched the finite element compaction simulation. Then, when UNIPACK had successfully completed the simulation, a postscript file of the results was automatically called-up and displayed on the computer screen. That file contained a series of fringe plots of spatial relative density at select times during the compaction process. FIG. 5 shows an example of a 3-dimensional fringe plot of the spatial relative density for the bushing pressing simulation after dual-action pressing (simultaneously pressing from the top and bottom to compact the powder) was completed.

The approximately 30,000 element compaction simulation for the bushing geometry required less than 30 minutes of computer processing time on an IBM laptop computer with a 266 MHz, Intel Pentium II chip, using the Linux operating system.

In another embodiment of the method of the present invention, the user employs the use of a graphical user interface to build the input parameter files. The user first defines the primary geometry of the component or forming die for the compaction simulation, considering the size and shape both before and after compaction by entering physical dimensions in specific data entry windows on the computer screen or by a data file. The user defines the transition radii between pieces, the pressing (boundary) conditions, and the material type of the component in a similar manner. The computer screen displays the component geometry in real time, such that the user can visualize and modify the geometry as deemed appropriate. Thus, the user constructs the geometric representation of the component to be evaluated through interaction with the computer program, and the user can get a real-time visual representation of the component primary geometry. At the user's direction, the UNIPACK computer code uses this information to construct and display the finite element mesh, and then, when acceptable by the user, the information is relayed to the finite element analysis program to automatically execute the powder compaction analysis and display the results. The development of the geometric representation can all be done interactively with the UNIPACK computer code of the present invention as embodied as a computer program in computing means such as a personal computer. In addition to the geometric variables mentioned, the properties of the simulated die and powder compact materials also can be varied, as well as the die wall friction coefficient(s) and the powder pressing (i.e., boundary) conditions. Because the user can specify the material characteristics as well as primary geometry and boundary conditions, the primary geometric design of a component and/or the pressing process can be fully evaluated to determine if it or they are acceptable for manufacturing purposes.

In another embodiment of the method of the present invention, the user employs the use of a graphical user interface to build the input parameter files using finished part dimensions that are different from the dimensions used in the finite element simulation. The user first defines the geometry of the component in its final, sintered form, by entering physical dimensions. The user defines the transition radii between pieces, the pressing (boundary) conditions, and the material type or properties of the component. The user then also enters a sintering shrinkage factor (the ratio of the sintered density to the pressed powder compact density), a powder compaction ratio (i.e., the ratio of the compacted powder pressed density to the loose powder bulk density), and any other pertinent scaling factors. The user-supplied information is then used to automatically generate the larger dimensions of the primary geometry of the pressing die and the component before pressing and sintering. The computer screen displays the primary component geometry in real time, such that the user can visualize and modify the geometry as deemed appropriate. At the user's direction, the UNIPACK code then uses this information to construct and display the finite element mesh, and then, when directed by the user, the information is relayed to the finite element analysis program to automatically execute the powder compaction analysis and display the results.

In another embodiment of the method of the present invention, a user picks at least one pre-defined axisymmetric geometric shape from a visual display menu of geometric shapes, such as a display on a computer monitor. If multiple shapes are picked, the user indicates the relative orientation of the shapes to each other; for example, a conic shape can be placed on top of a cylindrical shape. The algorithm of the present invention can query the user as to the number of shapes and the orientation, as well as the physical specifications of transition spaces and radii. Thus, the user constructs the geometric representation of the component to be evaluated through interaction with the computer algorithm (computer program), and the user can get a visual representation of the geometric representation. The user then invokes, through a standard input device (e.g., a keyboard), the execution of a standard routine to develop the finite element mesh for the shape(s) selected by the user, and views the finite element mesh for the overall geometric representation of the component. If acceptable, the user can then have the computer execute the deformation, nonlinear, quasi-static, finite element computer program and user standard input/output devices to view the results. If the geometric representation developed is not acceptable, the user can edit the file or re-initialize the program and pick different geometric shapes, orientations, dimensions, and transition spaces and radii to develop another representation of the component until the user is satisfied that the representation is acceptable.

The geometric shapes can be solid (i.e., can have only an outer radius to form, for example, a solid rod) or combinations of solid and hollow shapes such as for a counter bore (i.e., a toroid on top of a solid cylinder). In another embodiment, the geometric shapes can have different inner radii and the same outer radii, or different combinations thereof to make different geometry components. For example, a tube with a counter bore is created with a common outer diameter, but a different size bore at the top and the bottom. In another embodiment, one or more geometric shapes can have inner and outer radii that can be different at the top and bottom of the piece, allowing for the formation of a conical-shaped geometry, such as illustrated in FIG. 3. The number of pieces used to construct the primary component geometry in the simulation can be one or more pieces.

In another embodiment, the pressing conditions can be modified such that the primary geometry component is pressed only from the top-down, only from the bottom-up or by varied displacements from the top and bottom or with varying displacement times, for example, to balance the pressing conditions to minimize density gradients in the pressed powder compact. The pressing conditions can be modified such that the primary geometry component is pressed biaxially or isostatically.

The compaction modeling technology developed within this invention can be used to troubleshoot existing processing problems to improve yields, reduce waste, and develop more efficient manufacturing processes for problem parts. Some improvements can be realized with minor modifications in component/die design and/or the pressing process. The technology also can be used to improve tool and die design by identifying and addressing design problems in the initial stages of a project. The compaction software also can be used to identify potential problems and refine die designs prior to production. Tooling can then be designed with customer input, significantly reducing design and prototyping costs. Furthermore, the compaction software can aid ceramic component manufacturers expand the current design limits, which could lead to new products for new markets. A significant economic impact could be realized by designing parts that fire to net-shape without the need for green machining and/or hard grinding (i.e., diamond grinding) after sintering.

In addition to simulating powder pressing, the compaction modeling technology developed also provides a means to relate powder properties and characteristics to pressing behavior. Creating a good pressing powder is the first step towards a robust manufacturing process and the production of reliable components. The compaction model can provide a systematic means of assessing and understanding cause and effect between powder characteristics and powder compaction to optimize press powder manufacturing. Similarly, the compaction model can also be able to provide valuable information about ceramic powders and their limitations in pressing.

The invention being thus described, it will be apparent that the same may be varied in many ways. Such variations are not to be regarded as a departure from the spirit and scope of the invention, and all such modifications, as would be obvious to one skilled in the art, are intended to be included within the scope of the following claims.

What is claimed is:

1. A method of designing a primary geometry for a powder pressing application, comprising:
   generating a primary geometry of a component to be formed by powder pressing using a computer program through a user interface wherein the primary geometry is developed using a combination of predefined axisymmetric geometric shapes, said axisymmetric geometric shapes selected from cylinders, cones, toroids, spheres, parallelepipeds, ellipsoids, and polyhedrons, and transition radii to simulate said primary geometry, said predefined axisymmetric geometric shapes having variable dimensions;
   developing a finite element mesh representing said primary geometry, said finite element mesh generated automatically and internally through said computer program;
   defining pressing boundary conditions;
   defining a powder and powder material properties to be pressed in said primary geometry;
   calculating deformation characteristics of said powder and primary geometry using a deformation, nonlinear, quasi-static finite element code; and
   evaluating said deformation characteristics to determine the acceptability of said primary geometry.

2. The method of claim 1 further comprising the step of optionally modifying said primary geometry, said powder material properties of said component, and said pressing boundary conditions to form a component geometry for use in powder pressing.

3. The method of claim 1 wherein said powder is selected from a ceramic powder, a metal powder, a pharmaceutical powder, a plastic powder and mixtures thereof.

4. The method of claim 1 wherein said development of the finite element mesh and said calculation of the deformation characteristics are performed in less than 60 minutes.

5. The method of claim 4 wherein said development of the finite element mesh and said calculation of the deformation characteristics are performed on a personal computer.

6. The method of claim 1 wherein said finite element mesh represents a two-dimensional primary geometry.

7. The method of claim 1 wherein said finite element mesh represents a three-dimensional primary geometry.

8. The method of claim 1 wherein the primary geometry is the design a forming die.

9. The method of claim 1 wherein the primary geometry is generated with the aid of a graphical user interface on a computer.

10. The method of claim 1 wherein the step of generating the primary geometry uses said axisymmetric geometric shapes selected from a menu of axisymmetric geometric shapes interactively selected with the aid of a graphical user interface on a computer.

11. The method of claim 1 wherein the primary geometry is generated with the aid of a graphical user interface on a computer using physical dimensions from a finished part.

12. The method of claim 1 wherein the primary geometry is generated with the aid of a graphical user interface on a computer whereby the geometric shapes used to construct the primary geometry are selected from a display menu on a computer screen.

13. A method of designing a die geometry for a powder pressing applications comprising:
   generating a die geometry of a component to be formed by powder pressing using a computer program wherein the die geometry is developed using a combination of predefined axisymmetric geometric shapes, transition radii, and transition spaces to simulate said primary geometry, said predefined axisymmetric geometric shapes having variable dimensions, said axisymmetric geometric shapes selected from cylinders, cones, toroids, spheres, parallelepipeds, ellipsoids, and polyhedrons;
   developing a finite element mesh representing said die geometry, said finite element mesh generated automatically and internally through said computer program;
   defining pressing boundary conditions;
   defining a powder and powder material properties to be pressed in said primary geometry, said powder selected from a ceramic powder, a metal powder, a pharmaceutical powder, a plastic powder and mixtures thereof;
   calculating deformation characteristics of said powder and die geometry using a deformation, nonlinear, quasi-static finite element code; and
   evaluating said deformation characteristics to determine the acceptability of said die geometry.

* * * * *